US006839052B1

(12) United States Patent
Kramer

(10) Patent No.: US 6,839,052 B1
(45) Date of Patent: Jan. 4, 2005

(54) TWO DIMENSIONAL SOLID STATE CAPACITIVE SENSOR ARRAY

(75) Inventor: Alan Henry Kramer, Berkeley, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/487,059

(22) Filed: Jan. 19, 2000

(51) Int. Cl.$^7$ ................................................ G09G 5/00
(52) U.S. Cl. .................... 345/173; 345/174; 178/18.06
(58) Field of Search .................... 345/168, 169, 345/170, 174, 179, 173, 157, 160, 161; 178/18.06, 18.01, 18.03, 18.05, 18.07; 341/22, 33

(56) References Cited

U.S. PATENT DOCUMENTS

| | | | | |
|---|---|---|---|---|
| 4,053,789 A | * | 10/1977 | Shultz | 307/116 |
| 4,550,221 A | * | 10/1985 | Mabusth | 178/18.06 |
| 4,736,191 A | * | 4/1988 | Matzke et al. | 341/20 |
| 5,053,757 A | * | 10/1991 | Meadows | 345/173 |
| 5,392,058 A | * | 2/1995 | Tagawa | 345/104 |
| 5,543,591 A | * | 8/1996 | Gillespie et al. | 178/18.03 |
| 6,060,756 A | * | 5/2000 | Machida et al. | 257/415 |
| 6,150,996 A | * | 11/2000 | Nicholson et al. | 345/1.3 |
| 6,674,425 B1 | * | 1/2004 | Louis et al. | 345/173 |

OTHER PUBLICATIONS

Tartagni et al., "FP12.3: A 390dpi Live Fingerprint Imager Based on Feedback Capacitive Sensing Scheme," 1997 IEEE Solid–State Circuits Conference, pp. 200–201.*
Manaresi et al., "TA 7.6: A CMOS Micro Touch Pointer," 1999 IEEE Solid–State Circuits Conference, pp. 140–141.*
N. D. Young, et al., "Novel Fingerprint Scanning Arrays Using Polysilicon TFT's on Glass and Polymer Substrates", IEEE Electron Device Letters, vol. 18, Jan. 1, 1997, pp. 19–20.

* cited by examiner

*Primary Examiner*—Dennis-Doon Chow
(74) *Attorney, Agent, or Firm*—Lisa K. Jorgenson; Andre Szulwalski

(57) ABSTRACT

An apparatus for providing an output signal for selectively controlling movement of a visual pointer on a display screen is disclosed. A plurality of solid state capacitive sensor switches are arranged in a two-dimensional array. Each of the switches is actuable in response to the positioning of a finger of a user to an on/off state. A control unit responsive to the on/off state of each of the plurality of solid state capacitive sensors generates an output signal that selectively controls the movement of the visual pointer.

12 Claims, 2 Drawing Sheets

TWO DIMENSIONAL SOLID STATE CAPACITIVE SENSOR ARRAY

BACKGROUND OF THE INVENTION

1. Technical Field of the Invention

The present invention relates to the field of manual control of a cursor/pointer on a display screen, and more particularly, to the control of a cursor/pointer utilizing a solid state capacitive sensor array.

2. Description of Related Art

One of the most widely used types of user interfaces with a computer or television display screen is a screen cursor/pointer. The screen cursor/pointer normally comprises an arrow or some other type of visual indicating device whose position a user may control using a mouse, roller ball, joystick, or other type of apparatus for manipulating the position of the cursor/pointer on a display screen in order to select and manipulate information represented on the display screen.

The prior art provides several general types of devices for achieving screen cursor/pointer movement control. In a first type of device, of which a mouse is an example, continuous manual movement of the mouse across a generally horizontal surface (such as a mousepad) is required in order to produce a continuous corresponding direction of movement of the cursor/pointer across the display screen. This cursor/pointer movement stops when movement of the mouse stops. When the cursor/pointer must be moved a large screen distance, it is normally necessary to lift the mouse off the surface of the associated mouse pad, and then retrace the mouse over the horizontal surface one or more times.

A second type of device, of which a joystick is an example, responds to positioning of the joystick in an off center position. As long as the joystick is manually held in an off center position, the cursor/pointer continuously moves in a corresponding direction across the screen. In order to stop movement of the cursor/pointer, the joystick is returned to its center or neutral position.

Another implementation disclosed in U.S. patent application Ser. No. 09/012,065, entitled "Touchpad Providing Screen Cursor/Pointer Movement Control", filed Jan. 22, 1998, which is incorporated herein by reference, utilizes a plurality of capacitance sensing cells arranged in a row/column array to cooperate with a fingertip and produce an output signal that controls the movement of a cursor/pointer across a display screen. The output of each individual sensing cell is connected to a corresponding individual node of a resistor array that has end nodes arranged in a similar row/column array. A central output of the resistor node array configuration provides an output signal for controlling of cursor/pointer movement. A central output of the resistor nodes array configuration provides an output signal for control of cursor/pointer movement.

In the case of the first two implementations, large, bulky pieces of attached hardware are causing additional cost and size restrictions which may not be desirable in smaller computing applications, such as lap top computers. The implementation disclosed in U.S. patent application Ser. No. 09/012,065 suffers from the disadvantage that the silicon area on which the finger is placed, must be equal in size to the area of the finger. This can require quite a large silicon area and may be quite costly. Thus, a more size and cost efficient solution is desired.

SUMMARY OF THE INVENTION

The present invention overcomes the foregoing and other problems with an apparatus for providing an output signal for selectively controlling movement of a visual pointer on a display screen. The apparatus comprises a plurality of solid state capacitive sensor switches arranged in a two-dimensional array. The capacitive sensor switches are actuable in response to the positioning of a finger of a user to either an on and an off state. Each of the capacitive sensor switches includes a capacitive sensor which detects the presence of a user's finger in close proximity to capacitive sensor plates of the sensor and generates a signal of a selected voltage level in response thereto.

The generated signal is compared by a comparator to a reference voltage level to determine whether the switch is in the on or off state. The comparator generates an output signal indicating the state of the switch, and a flip-flop circuit latches the output of the comparator to the indicated on or off state. In response to the outputs from each of the solid state capacitive sensor switches, a control unit utilizing a control module stored therein generates an output signal which selectively controls the movement of a visual pointer in response to the finger positioning indicated by the two-dimensional array of capacitive sensor switches. In this way, the user may move a visual pointer across a display screen by merely moving his finger to various positionings on the switch array.

The plurality of solid state capacitive sensor switches may be interconnected with the control unit in a number of configurations. In a first embodiment, each capacitive sensor switch is individually connected to the control unit, such that the state of any particular switch may be known at any time. In another embodiment, a daisy chain configuration may be used wherein the plurality of capacitive sensor switches are interconnected with the control unit in a serial fashion such that information is passed from a control unit to each sensor in turn and then back to the control unit. A further embodiment utilizes a bus configuration to connect each of the capacitive sensor switches to the control unit. In this configuration, each capacitive sensor switch has an addressable location wherein the particular address or identifier associated with each capacitive sensor switch is stored within a memory associated with the control unit.

BRIEF DESCRIPTION OF THE DRAWINGS

For a more complete understanding of the present invention, reference is made to the following Detailed Description taken in conjunction with the accompanying drawings wherein.

DETAILED DESCRIPTION OF THE INVENTION

Figure 1:
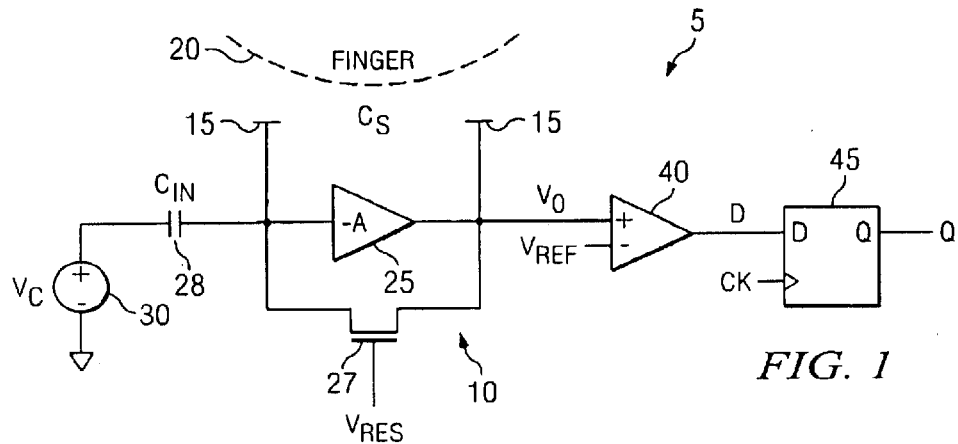
FIG. 1 is a schematic diagram of a solid state capacitive sensor switch according to the present invention.

Referring now to the Drawings, and more particularly to FIG. 1, there is illustrated a schematic diagram of the solid state capacitive switch sensor of the present invention. The solid state capacitive sensor switch 5 has capacitive sensor 10 including a pair of capacitive sensor plates 15 for interacting with the finger 20 of a user. The sensor plates 15 enable the capacitive switch 5 to detect the presence of a finger 20 in close proximity to the sensor plates 15. When a finger 20 is located in close proximity to the sensor plates 15, the output (Q) of the capacitive switch 5 will be a first level (i.e., logical "one"). The output (Q) of the switch is at a second level (i.e., logical "zero") in the absence of the finger. Interconnected between the sensor plates 15 is a charge integrator 25. Applied to the input of the capacitive sensor 10 is a variable charge voltage $V_c$ from variable voltage source 30. The charge voltage $V_c$ is applied to the input of the capacitive sensor 10 through an input capacitor 28. A reset voltage ($V_{res}$) is also applied across the input and output of the charge integrator 25 through a transistor 27.

The output ($V_o$) of the capacitive sensor 10 is applied to a positive input of a voltage comparator 40. The negative input of the voltage comparator 40 is connected to a reference voltage ($V_{ref}$). The reference voltage represent the transition level from a off state (logical "zero") to an on state (logical "one") of the switch 5. The output of the capacitive sensor 10 $V_o$ is an analog voltage value which varies based upon the proximity of a finger 20 to the sensor plates 15. The comparator output D is input to a flip-flop circuit 45. The flip-flop circuit 45 enables the output of the comparator 40 to be latched into an output Q of the flip-flop circuit in response to a provided clock signal $C_k$.

Figure 2:
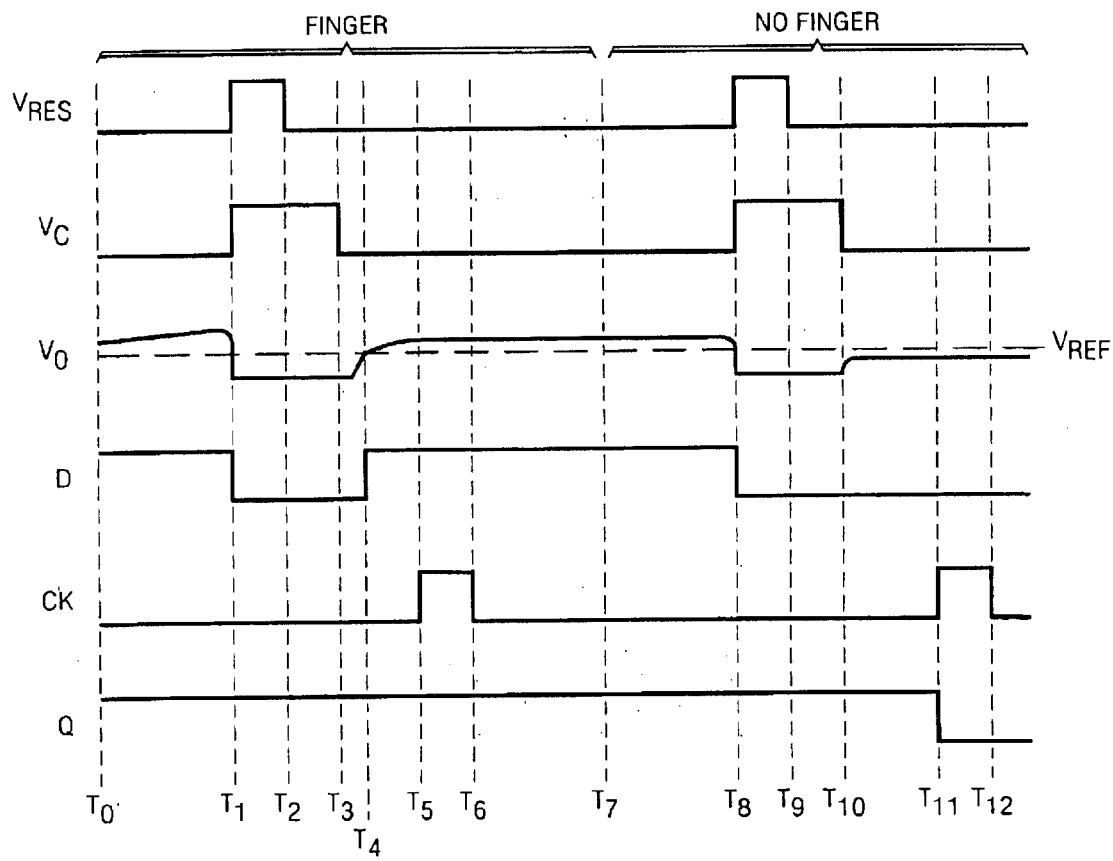
FIG. 2 is a timing diagram illustrating the operation of the solid state capacitive sensor switch of the present invention.

Referring now also to FIG. 2, there is illustrated a timing diagram of the operation of the capacitive sensor switch 5 of the present invention. The sensor cycle of the capacitive sensor switch 5 commences with the reset signal $V_{res}$ rising to a high value (i.e., logical "1") at $T_1$, $T_8$ which places the capacitive sensor 10 in a reset state causing the output voltage $V_o$ to drop to a minimum value. At the same time the reset voltage is raised, the charge voltage $V_c$ also resets to a high value (i.e., logical "1") at $T_1$, $T_8$. During the reset phase ($T_1$ to $T_3$; $T_8$ to $T_{10}$), the capacitive sensor 10 output $V_o$ remains at its minimum voltage level which is below the reference voltage $V_{ref}$. This enables the comparator 40 output D to remain at a low level (logical "0") during the reset process.

Following the end of the reset period, the charge integrator 25 is left in an active feedback state when the charge voltage $V_c$ drops to the low value (logical "0") at $T_3$, $T_{10}$. The high to low value transition of the charge voltage $V_c$ is translated through an input capacitor 28 into an input charge $Q_n$ which is integrated by the charge integrator 40 across capacitive sensor 10 to an output voltage $V_O$ corresponding to $Q_n/C_s$ (where $C_s$ equals capacitive value of the capacitive sensor 10).

When a finger 20 is located in close proximity to sensor plates 15, the value of $C_s$ between sensor plates 15 is small, and the output voltage $V_o$ of the capacitive sensor 10 rises above $V_{ref}$, initiating a high output value D (logical "1") from the comparator 40 at $T_4$. Conversely, when a finger 20 is not located in close proximity to the sensor plates 15, the value of $C_s$ is large and the output voltage $V_o$ remains below the reference voltage $V_{ref}$ causing the comparator to output a low value (logical "0") at $T_{10}$.

After a suitable interval following the high to low transition ($T_3$, $T_{10}$) of the charge voltage $V_c$ to enable the settling of the output voltage $V_o$ and the output D of the comparator 40, the output D of the comparator is sampled at $T_5$, $T_{11}$ by a clocked flip-flop circuit 45. The clocked flip-flop circuit 45 is responsive to an input clock signal $C_k$ to sample and latch the output D of the comparator into the output Q of the flip-flop circuit 45 at $T_5$, $T_{11}$. The flip-flop circuit 45 maintains the value of Q until the clock signal $C_k$ again initiates a sampling of output signal D of the comparator 45.

During each sensor cycle, the presence or absence of a finger or other conductive material near the sensor plates 15 is determined by the solid state capacitive sensor switch 5. The entire sensor cycle may be very fast, requiring less than a microsecond, but the power consumption of the switch 5 may be reduced by activating the sensor for only the minimum duty cycle, and the entire cycle can be increased to as much as 100 milliseconds. In this case, the sensor is active for only a microsecond or roughly one divided by 100,000 of the duty cycle.

Figure 3:
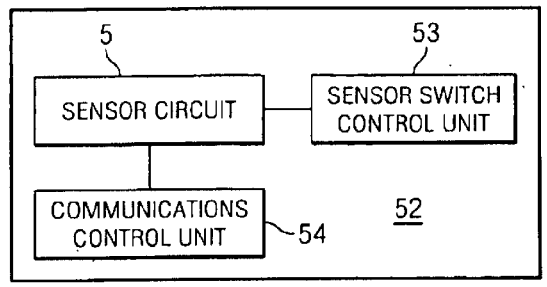
FIG. 3 is a block diagram of a capacitive sensor switch node of the present invention.
Figure 4A:
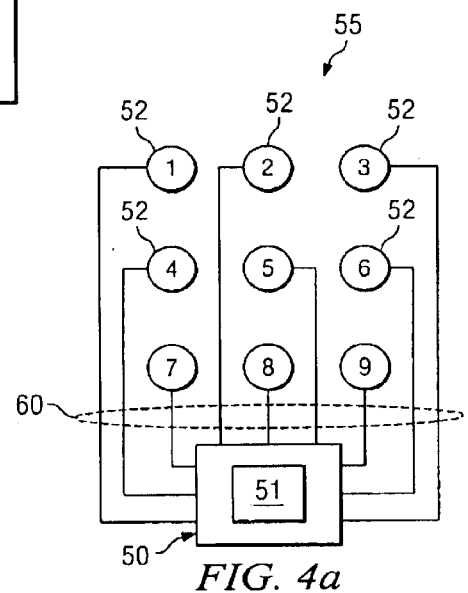
FIGS. 4A–4C comprise various embodiments for interconnecting an array of solid state capacitive sensor switching to a central control unit.
Figure 4B:
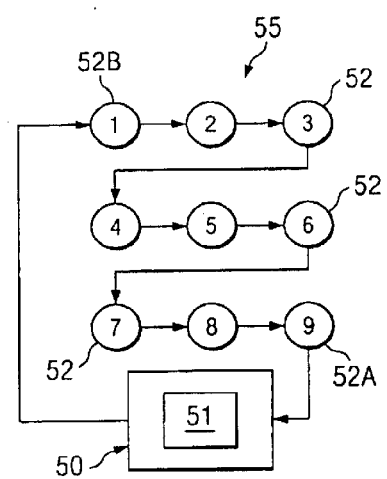
Figure 4C:
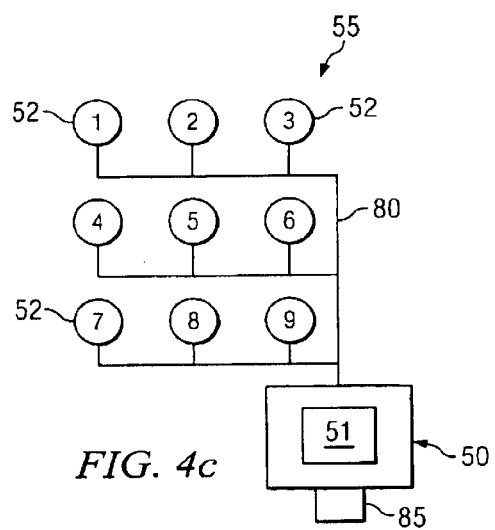

Referring now to FIG. 3, there is illustrated a block diagram of the circuitry associated with the capacitive sensor switch nodes 52 described in FIGS. 4A–4C. A Capacitive Sensor switch node 52 consists of the sensor circuit 5, discussed previously with respect to FIG. 1, a sensor switch control unit 53 for controlling the sensor circuit 5 and a communications control unit 54 for controlling communications between the sensor node 52 and additional nodes 52 or a master control unit 50, as will be more fully described with respect to FIGS. 4A–4C.

Referring now to FIGS. 4A–4C, there are illustrated various methods for interconnecting a two-dimensional array 55 of solid state capacitive sensor switch nodes 52 with a controller unit 50. The sensor array 55 represented by the plurality of capacitive switch nodes 52 detects the positioning of a finger upon the array. In response to the positioning of the finger, certain ones of the nodes 52 output signals Q, and the control unit 50, preferably comprising some type of processing means, responds by generating cursor/pointer control information for transmission to a display (not shown) on which a cursor/pointer is located using a control routine 51 associated with the control unit 50 responsive to the on/off state of the capacitive switches. While the following description of FIGS. 4A–4C is done with respect to a three-by-three configuration of solid state capacitive sensor switch nodes 52, it should be realized that arrays of varying sizes, such as 4×4, 5×5, and in fact any arbitrary n×m rectangular array or even arbitrary nonrectangular (i.e., hexagonal) arrangements arrays may also be used.

FIG. 4A represents a star configuration wherein each sensor switch 5 has a dedicated link 60 to the control unit 50. Each dedicated link 60 value comprises a single wire carrying either a switch's output signal Q indication of a high value ("on" or logical "1") or a low value ("off" or logical "0"). As each of the dedicated links 60 are connected to the control unit 50 in parallel, the control unit 50 may know the state of each individual solid state capacitive switch 5 at all points within the array 60 without restriction. As a practical matter, the star configuration works well for switch matrices approaching tens or even several hundreds of nodes, but becomes prohibitively expensive beyond this point. In this embodiment, the communications control unit 54 of FIG. 3 would merely output the output state of the sensor latch 45 of the sensor circuit 5 onto the dedicated link 60, and is thus optional.

FIG. 4B discloses a daisy chain configuration wherein each solid state capacitive switch node 52 is linked to neighboring switches and one of the neighboring switches is located closer to the control unit 50 in terms of position along a chain than the other is located. The solid state capacitive sensor switch node 52A located closest to the control unit 50 is linked directly to the control unit in one direction, and the node 52B furthest from the control unit is linked only to a single switch neighbor and to the control unit. This configuration creates a unidirectional ring rotating through each of the solid state capacitive switch nodes 52 that begins and ends at the control unit 50. Each node 52 includes a communication link to each of its nearest neighbors. Alternative embodiments may include as many as four or five links from each switch 5 depending whether bidirectional communication of an asynchronous or synchronous type is used.

A typical communication protocol utilized within a daisy chain configuration enables the control unit 50 to initiate a polling requests over the communication ring causing each switch 5 within the ring to transmit their state ("on" or "off"; "1" or "0") around the ring to the control unit 50, like a large shift register. The daisy chain communication protocol provides the advantage that no practical upper limit on the number of nodes within the ring is present, and the configuration is very simple and costs efficient to implement. However, the protocol requires at least two communication wires to each node for implementation.

With respect to FIG. 4B, the communications control unit 54 of FIG. 3 could only pass on to a next node 52 a data packet consisting of a command portion and data portion. Two commands which might be defined within the protocol would include DATA and DONE (RESET could be added as a third command if needed). The master control unit 50 would initiate a pole of a node 52 by sending a command packet for DATA with null (0) data to a first node 52B in the chain. The control unit 50 next sends a command for DONE with null data to the first node 52B. The communications control unit 54 of each node 52 upon receipt of the DATA command passes the command along to the next node in its entirety, including whatever data value was contained within that command earlier in the sequence. Once a node 52 receives the DONE command, the node latches the state of its sensor circuit 5 and adds a DATA command to the sequence containing data corresponding to the state of its sensor circuit 5, followed by the DONE command. In this manner, each node 52 in the chain will sense and communicate the state of their sensor circuit 5 to the control unit 50 in the proper sequence.

Referring now to FIG. 4C, there is illustrated a bus configuration which utilizes a serial communication protocol. In the bus configuration, each solid state capacitive switch node 52 is linked to a shared bus 80 connected to the control unit 50. In a bus configured network, each solid state capacitive switch nodes 52 has a unique address associated therewith. The address is stored within a nonvolatile memory (not shown) associated with the communications control unit 54 of each node 52. Alternatively, a daisy chain based addressing scheme may be utilized avoiding the need for a non-volatile memory 85, but adding the necessity of two communication wires for each switch.

In a unimaster bus protocol configuration, the control unit 50 acts as bus master and requests, over the bus 80, the state of a particular switch 5. Information from the switch 5 is communicated back to the control unit 50 over the same bus 80. Examples of various types of bus communication protocols which might be utilized include the I²C protocol requiring two wires for the bus 80, and the universal serial bus (USB) protocol for a unimaster bus configuration based upon two wires used to communicate a single signal differentially. A USB-like protocol could be implemented on a unipolar signaling bus requiring only a single communication wire to each switch. Such a unipolar signaling scheme will result in a more limited communication speed than the 12 Mbps achieved by USB, which should, however, be sufficiently fast for this class of applications, especially given that wire lengths are expected to be short. Bus based serial communications protocols have the advantage that there is no upper practical limit on the number of switches which may be added to the array 55. Furthermore, the array 55 can be interconnected with the control unit 50 using only a single communication wire.

With respect to the embodiment of FIG. 4C, the communication control unit 54 of FIG. 3 of the node 52 will store a local addresses of the node 52 and monitor the address communicated over the bus 80. A bus master protocol may consist of two simple packets, namely address and data packets. The master control unit 50 controls the address phase of the communication on the bus 80, and a sensor communication control unit 54 controls the data phase of communications on the bus. The master control unit 50 will initiate a communication by placing the address of a node 52 on the bus 80 in the address phase of communication. Each sensor communication control unit 54 will monitor this address and compare it to the individual address the units have locally stored. The sensor communication control unit 54 having the local address matching the communicated address latches the state of its sensor circuit 5 and communicates the data contained within the circuit back to the control unit 50 during the data phase of communication. This sequence is repeated for each, address in the system enabling the control unit 50 to query the state of each node on the network in any desired sequence. This essentially comprises the protocol of any generic memory bus with the difference that the communication is managed through a serial link rather than a full parallel bus, which requires a serial bus protocol such as that used by USB.

By interconnecting the array of nodes 52 in any of the above-described configurations to the control unit 50, the position of a fingertip of a user upon the array may be detected and utilized to control a cursor/indicator upon a display screen. A control protocol may be implemented by a control module 90 (FIG. 1) within the control unit 50. The control module 90 controls a cursor/pointer and describes specific responses based upon detection of a finger on a particular subset of switches in the array 55. For example, a cursor/pointer could be moved in an upward direction if the user's finger was detected closing the top center switch (labeled as 2 in FIGS. 4A–4B) and any other switches within a top row of the switch array 55. Likewise, movement of the cursor/pointer in the downward, leftward or rightward directions would similarly be actuated by detection of closing of switches 8, 4 and 6, respectively, and any switches within these rows. The upper left switch (labeled 1 in FIGS. 3A–3B) would indicate movement of a cursor/pointer in the upper left direction. Likewise, switches 3, 9 and 7 would indicate movement in the upper right, lower right and lower left directions, respectively. Actuation of the center switch, labeled 5, corresponds to centering of the cursor/pointer as with a joystick. By utilizing this control protocol within the control unit 50, the cursor/pointer on a display screen may be effectively controlled utilizing the described array 55.

In addition to providing a lower costs apparatus for pointer control, the two-dimensional array 55 of solid state capacitive sensor switch 52 will provide a lower cost implementation in terms of power consumption due to the vastly simplified control algorithm. This type of control array is well suited to applications, such as a television pointer control or web T.V., wherein the need for low cost, small size and power efficient solutions is critical.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. An apparatus for providing an output signal for selectively controlling movement of visual pointer on a display screen, comprising:

a plurality of solid state capacitive fingertip sensor switches including a center switch surrounded by a plurality of peripheral switches, each switch actuable to an on/off state in response to detection of a user's fingertip; and a control unit responsive to changes in the on/off state of one or more of the peripheral switches of the plurality of solid state capacitive fingertip sensor switches for generating the output signal designating a direction of movement of the visual pointer and further responsive to the on/off state of the center switch of the plurality of solid state capacitive fingertip sensor switches for generating the output signal designating a centering of the visual pointer as with a joystick.

2. The apparatus of claim 1, wherein the plurality of solid state capacitive sensor switches are each separately connected to the control unit.

3. The apparatus of claim 1, wherein the plurality of solid state capacitive sensor switches are interconnected with the control unit via a bus.

4. The apparatus of claim 1, wherein each of the plurality of solid state capacitive sensor switches further comprises:

a capacitive sensor for detecting a presence of a user's fingertip in close proximity thereto, the capacitive sensor generating a signal at a first voltage level if the user's fingertip is detected and the signal at a second voltage level if the user's fingertip is not detected;

a comparator for comparing the voltage level of the signal generated by the capacitive sensor to a reference voltage, the comparator generating a first value if the voltage level of the signal is above the reference voltage and a second value if the voltage level of the signal is below the reference voltage; and circuitry for latching an output of the solid state capacitive sensor switch to a constant value in response to the first and second values of the comparator.

5. The apparatus of claim 4, wherein each capacitive sensor comprises:

a plurality of capacitive sensor plates for detecting the presence of a user's fingertip in close proximity thereto; and a charge integrator connected between the capacitive sensor plates.

6. An apparatus, comprising:

an array of capacitive sensors for detecting presence of a user fingertip, each generating a signal in response thereto, the array including a center sensor and a plurality of peripheral sensors; and a control unit coupled to the array of capacitive sensors and adapted to receive the signals and generate an output signal indicative of cursor centering as with a joystick in response to receipt of the center sensor signal and further indicative of cursor movement in response to receipt of one or more of the peripheral sensors signals, the indicated movement being in a direction designated by which one or ones of the peripheral sensors detect fingertip presence.

7. The apparatus of claim 6, wherein the array of capacitive sensors is a two dimensional array.

8. The apparatus of claim 6, wherein each sensor in the array of capacitive sensors is individually interconnected with the control unit.

9. The apparatus of claim 6, wherein the array of capacitive sensors are interconnected with the control unit via a bus.

10. The apparatus of claim 6, wherein each capacitive sensor comprises:

a sensor for detecting a presence of the user fingertip in close proximity thereto, the sensor generating a signal at a first voltage level if the user's finger is detected and the signal at a second voltage level if the user fingertip is not detected;

a comparator for comparing the voltage level of the signal generated by the sensor to a reference voltage, the comparator generating a first value if the voltage level of the signal is above the reference voltage and a second value if the voltage level of the signal is below the reference voltage; and circuitry for latching an output of the sensor to a constant value in response to the first and second values of the comparator.

11. The apparatus of claim 10, wherein each sensor comprises:

a plurality of capacitive sensor plates for detecting the presence of the user fingertip in close proximity thereto; and a charge integrator connected between the plurality of capacitive sensor plates.

12. A visual pointer controller, comprising:

a capacitive fingertip sensor array comprising a center sensor and a plurality of peripheral sensors surrounding the center sensor; and a controller circuit connected to the array and operative responsive to array detection of a user's fingertip to move the visual pointer in a direction indicated by peripheral sensor detection of the user's fingertip and center the visual pointer as with a joystick in response to center sensor detection of the user's fingertip.

* * * * *

UNITED STATES PATENT AND TRADEMARK OFFICE
CERTIFICATE OF CORRECTION

PATENT NO. : 6,839,052 B1
DATED : January 4, 2005
INVENTOR(S) : Alan Henry Kramer It is certified that error appears in the above-identified patent and that said Letters Patent is hereby corrected as shown below:

Column 3,
Line 57, please replace "at $T_{10}$" with -- at $T_8$ --.

Column 4,
Line 42, please delete "value" after "60" and before "comprises".
Line 48, please replace "5" with -- 52 --.

Column 6,
Line 21, please delete the "," after the word "each".
Line 34, please replace "control module 90 (FIG. 1)" with -- control module 51 --.
Line 35, please replace "control module 90" with -- control module 51 --.

Signed and Sealed this

Eighteenth Day of October, 2005

JON W. DUDAS
*Director of the United States Patent and Trademark Office*